(12) United States Patent
Lee

(10) Patent No.: US 10,868,272 B2
(45) Date of Patent: Dec. 15, 2020

(54) DISPLAY DEVICE AND MANUFACTURING METHOD THEREOF

(71) Applicant: Samsung Display Co., Ltd., Yongin-si (KR)

(72) Inventor: Hyeon Bum Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/204,741

(22) Filed: Nov. 29, 2018

(65) Prior Publication Data

US 2019/0252639 A1 Aug. 15, 2019

(30) Foreign Application Priority Data

Feb. 12, 2018 (KR) .......................... 10-2018-0017271

(51) Int. Cl.
| | | |
|---|---|---|
| *H01L 51/52* | (2006.01) | |
| *H01L 27/32* | (2006.01) | |
| *G06F 3/041* | (2006.01) | |
| *G06F 3/044* | (2006.01) | |
| *G09G 3/3225* | (2016.01) | |

(52) U.S. Cl.
CPC .......... *H01L 51/5253* (2013.01); *G06F 3/044* (2013.01); *G06F 3/0412* (2013.01); *H01L 27/323* (2013.01); *H01L 27/3272* (2013.01); *H01L 51/5246* (2013.01); *G06F 2203/04103* (2013.01); *G09G 3/3225* (2013.01)

(58) Field of Classification Search
CPC .................. G06F 3/044; G06F 3/0412; G06F 2203/04103; G09G 3/3225; H01L 51/5253; H01L 51/5246; H01L 27/3272; H01L 27/323; H01L 27/3262; H01L 27/3276

See application file for complete search history.

(56) References Cited

U.S. PATENT DOCUMENTS

| | | | |
|---|---|---|---|
| 7,915,823 B2 | 3/2011 | Hayashi | |
| 2011/0114957 A1* | 5/2011 | Kim | H01L 29/78633 257/59 |

(Continued)

FOREIGN PATENT DOCUMENTS

| | | |
|---|---|---|
| EP | 3217265 | 9/2017 |
| EP | 3264485 | 1/2018 |

(Continued)

OTHER PUBLICATIONS

Extended European Search Report dated Jul. 9, 2019, in European Patent Application No. 19152004.8.

*Primary Examiner* — Brent D Castiaux
(74) *Attorney, Agent, or Firm* — H.C. Park & Associates, PLC

(57) ABSTRACT

A display device includes a substrate, a thin film encapsulation layer, a cover layer, and a touch unit. The substrate includes a display area including pixels, and a non-display area disposed outside the display area. The thin film encapsulation layer is disposed on the substrate. The cover layer overlaps an edge of the thin film encapsulation layer such that the cover layer is disposed on an edge of the display area and in the non-display area. The touch unit is disposed on the thin film encapsulation layer and the cover layer. The cover layer includes a light blocking material.

20 Claims, 14 Drawing Sheets

(56) References Cited

U.S. PATENT DOCUMENTS

| | | | |
|---|---|---|---|
| 2015/0185527 A1* | 7/2015 | Chang | H01L 51/5246 |
| | | | 349/12 |
| 2015/0243711 A1 | 8/2015 | Hong et al. | |
| 2016/0306472 A1* | 10/2016 | Park | H01L 27/323 |
| 2017/0097707 A1 | 4/2017 | Kim et al. | |
| 2017/0213872 A1* | 7/2017 | Jinbo | H01L 51/0097 |

FOREIGN PATENT DOCUMENTS

| | | |
|---|---|---|
| KR | 10-2016-0124319 | 10/2016 |
| KR | 10-2017-0040423 | 4/2017 |
| KR | 10-2017-0090382 | 8/2017 |

\* cited by examiner

DISPLAY DEVICE AND MANUFACTURING METHOD THEREOF

CROSS-REFERENCE TO RELATED APPLICATION

This application claims priority from and the benefit of Korean Patent Application No. 10-2018-0017271, filed Feb. 12, 2018, which is hereby incorporated by reference for all purposes as if fully set forth herein.

BACKGROUND

Field

One or more exemplary embodiments generally relate to a display device and a manufacturing method thereof, and more particularly, to a display device capable of preventing a change of touch sensitivity of a touch unit and preventing light leakage of an edge of a display area, and a manufacturing method thereof.

Discussion

Display devices, such as a liquid crystal display (LCD), an organic light emitting diode display (OLED display), an electrophoretic display, and the like, typically include a field generating electrode and an electro-optical active layer. For example, an organic light emitting device includes an organic emission layer as an electro-optical active layer. The field generating electrode may be connected to a switching element, such as a thin film transistor, and may receive a data signal. The electro-optical active layer displays images by converting the data signal into an optical signal.

When an impurity, such as moisture or oxygen, is introduced into the display device from the outside, a lifespan of an electrical element included in the display device may be reduced, and emission efficiency of an emission layer of the organic light emitting device may be deteriorated. To prevent this, when the display device is manufactured, it is encapsulated by isolating the internal electrical elements from the outside so that the impurity, such as moisture, may not permeate the display device, and an encapsulation method may include a method for forming an encapsulation portion by stacking a plurality of thin films on a display area.

A touch sensor for a user to contact a screen with a finger or a pen and input information may be applied as an input device of the display device. From among various sensing methods of a touch unit including a touch sensor, a capacitive type for sensing a position where a change of capacitance caused by a contact at (or near) two electrodes separated from each other may be used. When a height of an insulating layer disposed below the touch unit is not constant or includes steps, parasitic capacitance between an electrode (e.g., cathode) formed below the touch unit and a touch electrode of the touch unit may increase at a portion where the insulating layer disposed below the touch unit is thin. When unnecessary parasitic capacitance becomes larger between the touch electrode and a lower electrode, it may influence the touch sensing characteristic of the touch sensor of the touch unit.

Light emitted by the display area including a plurality of pixel areas for displaying images may be reflected again by the touch electrode of the touch unit overlapping the display area, the light reflected in this way may leak toward the edge of the display area and may be seen as a light leakage at the edge of the display area. In this manner, the light leakage becomes a cause of deteriorating display quality of the display device.

The above information disclosed in this section is only for understanding the background of the inventive concepts, and, therefore, may contain information that does not form prior art.

SUMMARY

Some exemplary embodiments provide a display device capable of preventing changes in touch sensitivity of a touch unit of a display device and preventing light leakage at an edge of a display area.

Some exemplary embodiments provide a manufacturing method of a display device capable of preventing changes in touch sensitivity of a touch unit of a display device and preventing light leakage at an edge of a display area.

Additional aspects will be set forth in the detailed description which follows, and, in part, will be apparent from the disclosure, or may be learned by practice of the inventive concepts.

According to some exemplary embodiments, a display device includes a substrate, a thin film encapsulation layer, a cover layer, and a touch unit. The substrate includes a display area including pixels, and a non-display area disposed outside the display area. The thin film encapsulation layer is disposed on the substrate. The cover layer overlaps an edge of the thin film encapsulation layer such that the cover layer is disposed on an edge of the display area and in the non-display area. The touch unit is disposed on the thin film encapsulation layer and the cover layer. The cover layer includes a light blocking material.

In some exemplary embodiments, the thin film encapsulation layer may be thinner at the edge of the thin film encapsulation layer than at a center of the thin film encapsulation layer, and heights of upper surfaces of the thin film encapsulation layer and the cover layer from a surface of the substrate may be substantially equivalent. The upper surfaces may be substantially flat.

In some exemplary embodiments, the touch unit may include touch electrodes and touch wires connected to the touch electrodes, and the cover layer may overlap the touch wires.

In some exemplary embodiments, the display device may further include a driving voltage line and spacers disposed in the non-display area. In a view perpendicular to the surface of the substrate, the cover layer may overlap the driving voltage line. In the view perpendicular to the substrate of the substrate, the cover layer may overlap a first spacer among the spacers and may be spaced apart from a second spacer among the spacers.

In some exemplary embodiments, the thin film encapsulation layer may include inorganic insulating layers and at least one organic insulating layer, and in a direction perpendicular to the surface of the substrate, the inorganic insulating layers of the thin film encapsulation layer may be disposed between the cover layer and the substrate.

In some exemplary embodiments, the thin film encapsulation layer may include inorganic insulating layers and at least one organic insulating layer, and in a direction perpendicular to the surface of the substrate, the organic insulating layer and the cover layer may be disposed between at least two of the inorganic insulating layers of the thin film encapsulation layer.

According to some exemplary embodiments, a display device includes a substrate, a thin film encapsulation layer, a first cover layer, a second cover layer, and a touch unit. The substrate includes a display area including pixels, and a non-display area disposed outside the display area. The thin film encapsulation layer is disposed on the substrate. The first cover layer is disposed on the thin film encapsulation layer and in the non-display area. The second cover layer is disposed on the thin film encapsulation layer and in the display area. The touch unit is disposed on the first cover layer and the second cover layer. The first cover layer includes a light blocking material. The second cover layer is at least translucent.

In some exemplary embodiments, upper surfaces of the first cover layer and the second cover layer may have substantially equivalent heights from a surface of the substrate, and the upper surfaces may be substantially flat.

In some exemplary embodiments, the touch unit includes touch electrodes and touch wires connected to the touch electrodes, the first cover layer may overlap the touch wires, and the second cover layer may overlap the touch electrodes.

In some exemplary embodiments, the display device may further include a driving voltage line and spacers disposed in the non-display area. The first cover layer may overlap the driving voltage line. In a direction perpendicular to the surface of the substrate, the first cover layer may overlap a first spacer among the spacers. In the direction perpendicular to the surface of the substrate, the first cover layer may be spaced apart from a second spacer among the spacers.

According to some exemplary embodiments, a method of manufacturing a display device includes forming a thin film encapsulation layer on a substrate, the substrate including a display area comprising pixels, and a non-display area disposed outside the display area. The method further includes: forming a cover layer overlapping an edge of the thin film encapsulation layer, the cover layer being formed on an edge of the display area and in the non-display area; and forming a touch unit on the thin film encapsulation layer and the cover layer. Forming the cover layer includes stacking an organic material comprising a light blocking material, and performing a photolithography process.

In some exemplary embodiments, the thin film encapsulation layer may be thinner at the edge of the thin film encapsulation layer than at a center of the thin film encapsulation layer, and upper surfaces of the thin film encapsulation layer and the cover layer may be formed to have substantially equivalent heights from a surface of the substrate. The upper surfaces may be formed to be substantially flat.

In some exemplary embodiments, forming the touch unit may include forming touch electrodes on the substrate and touch wires connected to the touch electrodes, and the cover layer may be formed to overlap the touch wires In some exemplary embodiments, the method may further include forming a driving voltage line and spacers in the non-display area. In a direction perpendicular to the surface of the substrate, the cover layer may be formed to overlap the driving voltage line, may overlap a first spacer among the spacers, and may be spaced apart from a second spacer among the spacers.

In some exemplary embodiments, the thin film encapsulation layer may be formed including inorganic insulating layers and at least one organic insulating layer, and in a direction perpendicular to a surface of the substrate, the cover layer and the at least one organic insulating layer may be disposed between at least two of the inorganic insulating layers.

According to some exemplary embodiments, a method of manufacturing a display device includes forming a thin film encapsulation layer on a substrate, the substrate including a display area comprising pixels, and a non-display area disposed outside the display area. The method further includes: forming a first cover layer on the thin film encapsulation layer and in the non-display area; forming a second cover layer on the thin film encapsulation layer and in the display area; and forming a touch unit on the first cover layer and the second cover layer. The second cover layer is formed of an at least translucent organic material. Forming the first cover layer includes stacking an organic material including a light blocking material, and performing a photolithography process.

In some exemplary embodiments, forming the second cover layer may include stacking, via inkjet printing, an organic material in a region surrounded by the first cover layer.

In some exemplary embodiments, upper surfaces of the first cover layer and the second cover layer may be formed to have substantially equivalent heights from a surface of the substrate, and the upper surfaces may be formed to be substantially flat.

In some exemplary embodiments, forming the touch unit may include forming touch electrodes and touch wires connected to the touch electrodes, the first cover layer may be formed to overlap the touch wires, and the second cover layer may be formed to overlap the touch electrodes.

In some exemplary embodiments, the method may further include forming a driving voltage line and spacers in the non-display area. In a direction perpendicular to the surface of the substrate, the cover layer may be formed to overlap the driving voltage line, to overlap a first spacer among the spacers, and to be spaced apart from a second spacer among the spacers.

According to various exemplary embodiments, change in touch sensitivity of a touch unit of a display device may be prevented, and light leakage at an edge of a display area of the display device may also be prevented.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
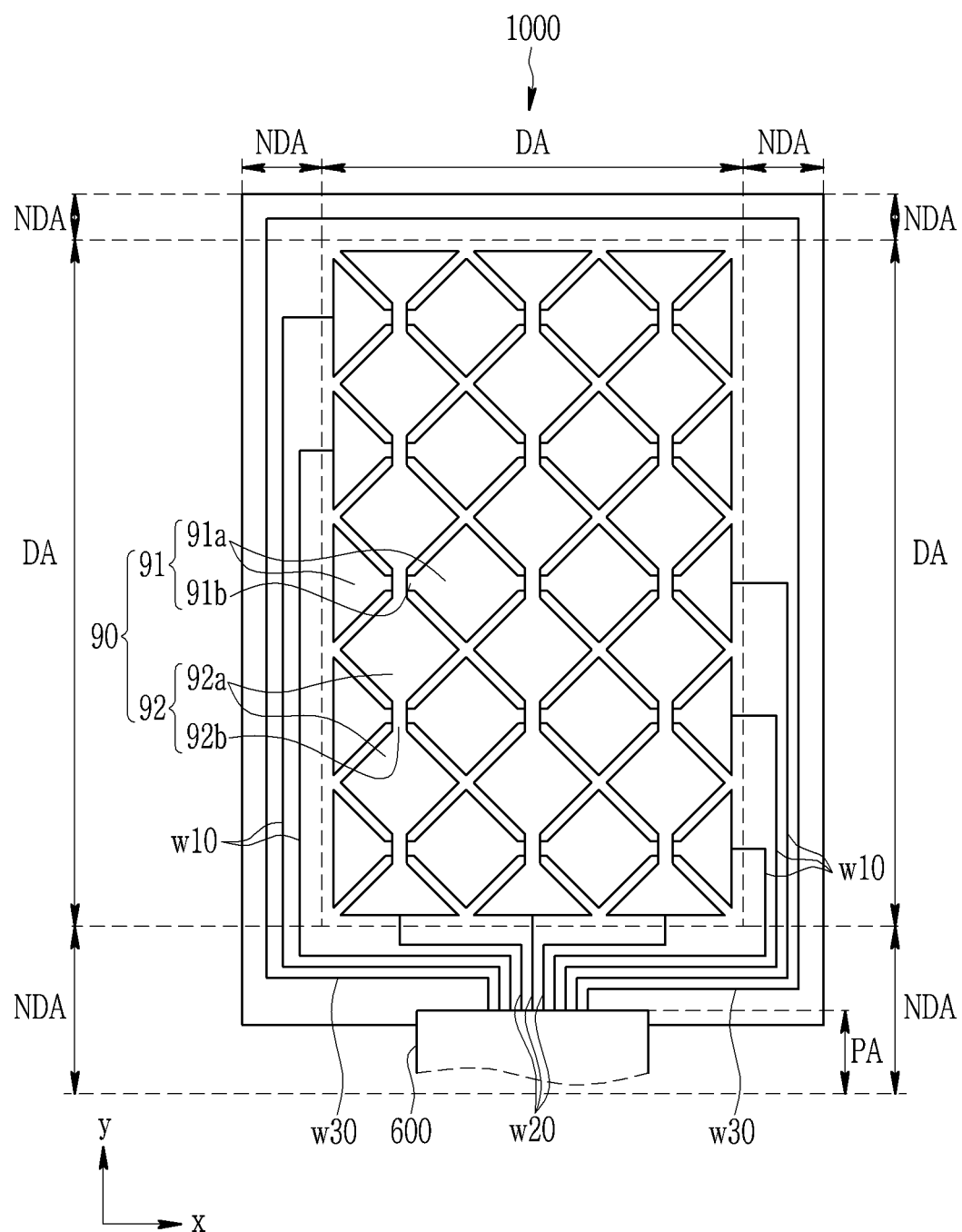
FIG. 1 shows a top plan view of a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure. For the purposes of this disclosure, the phrase "on a plane" or "in a plan view" means viewing an object portion from above, and the phrase "on a cross-section" or "in a cross-sectional view" means viewing, from a side, a cross-section of which the object portion is vertically cut.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Figure 2:
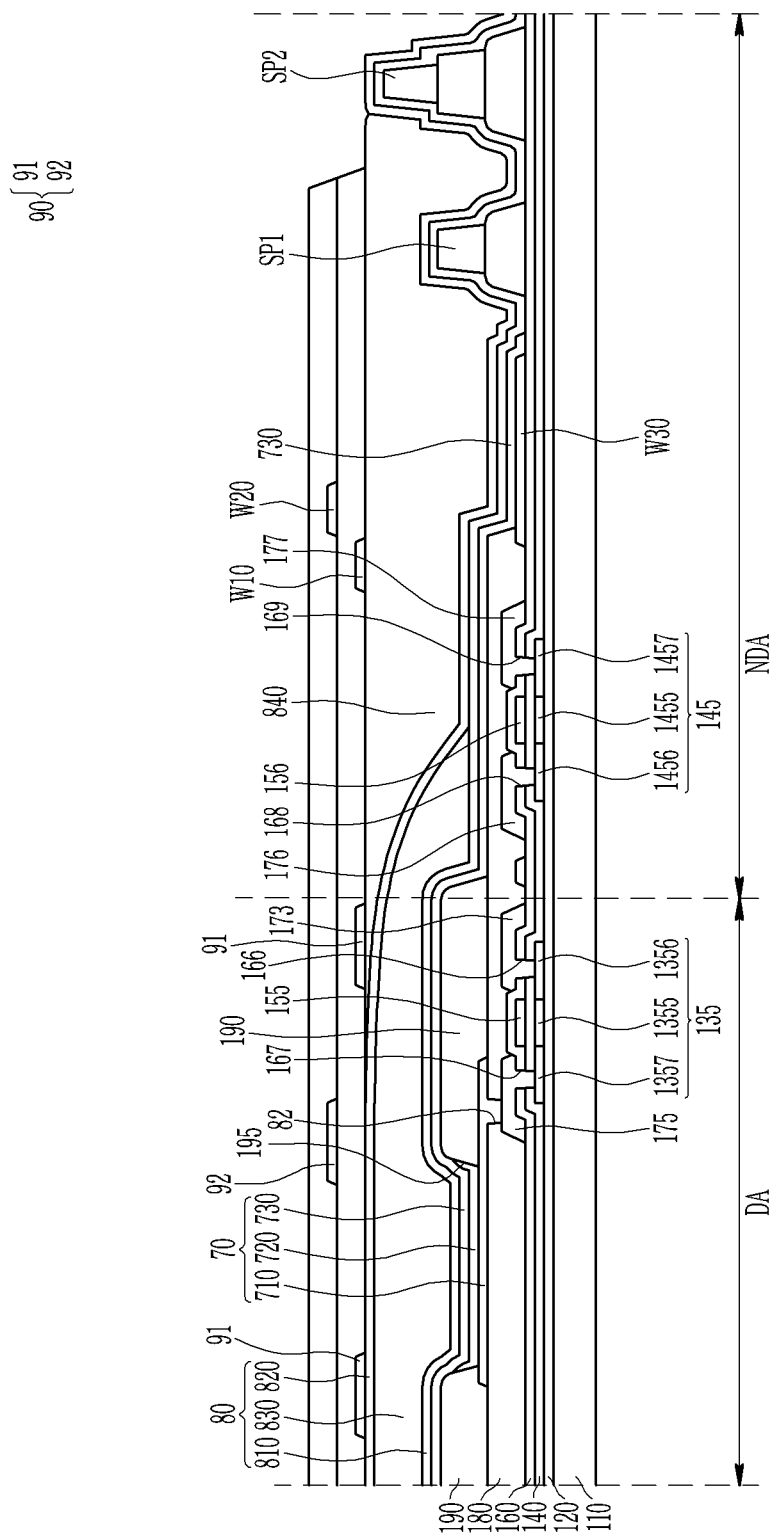
FIG. 2 shows a cross-sectional view of part of a display device according to some exemplary embodiments.
Figure 3:
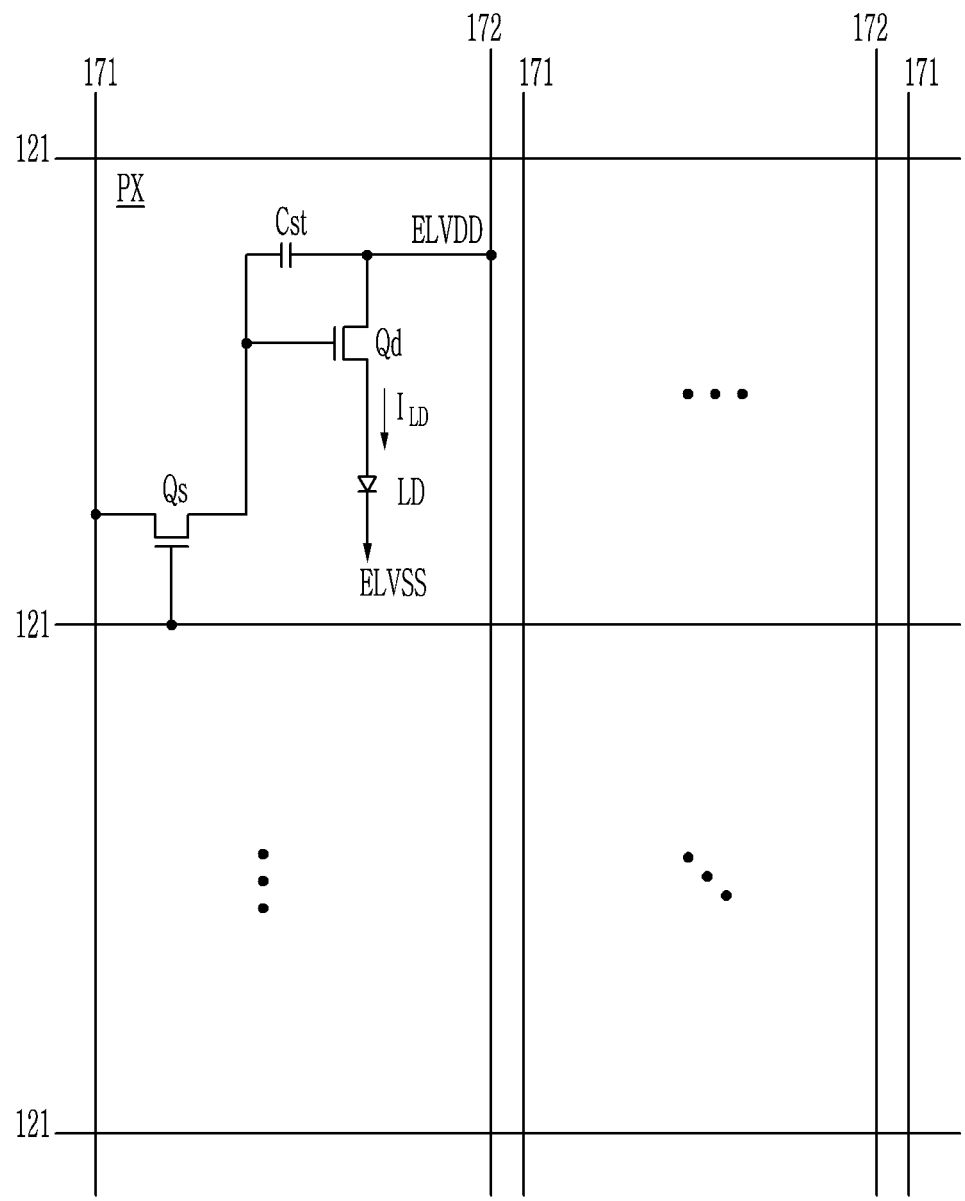
FIG. 3 shows an equivalent circuit diagram of a pixel of a display device according to some exemplary embodiments.

A display device according to some exemplary embodiments will now be described with reference to FIGS. 1 to 3. FIG. 1 shows a top plan view of a display device according to some exemplary embodiments. FIG. 2 shows a cross-sectional view of part of a display device according to some exemplary embodiments. FIG. 3 shows an equivalent circuit diagram of a pixel of a display device according to some exemplary embodiments.

Referring to FIG. 1, a display device 1000 includes a display area DA for displaying an image, and a non-display area NDA disposed outside the display area DA.

The non-display area NDA includes a driving area PA. In the driving area PA, a driver 600 connected to driving signal lines w10, w20, and w30 for transmitting a signal to the display area DA and applying a driving voltage to the driving signal lines w10, w20, and w30 is disposed. The driving signal lines w10, w20, and w30 include touch wires w10 and w20 and a common voltage transmitting line w30.

The display area DA includes a plurality of pixels (not shown), and it includes a touch unit including a touch electrode 90 overlapping the display area DA. A configuration of a display area DA and a non-display area NDA of a display device according to some exemplary embodiments will be described with reference to FIGS. 2 and 3.

Referring to FIG. 3, the display area DA of the display device 1000 includes a plurality of signal lines 121, 171, and 172, and a plurality of pixels PXs connected thereto and substantially arranged in a matrix form. The pixel PX represents a minimum unit for displaying an image, and the display device 1000 displays images using a plurality of pixels PXs.

The signal lines 121, 171, and 172 include a plurality of gate lines 121 for transmitting a gate signal (or a scanning signal), a plurality of data lines 171 for transmitting a data signal, and a plurality of driving voltage lines 172 for transmitting a driving voltage ELVDD. The gate lines 121 substantially extend in a first (e.g., row) direction and are substantially parallel with each other, and vertical portions of the data line 171 and the driving voltage line 172 substantially extend in a second (e.g., column) direction and are substantially parallel with each other.

The pixel PX includes a switching thin film transistor Qs, a driving thin film transistor Qd, a storage capacitor Cst, and an organic light emitting diode (OLED) LD. Although not shown in the drawings, one pixel PX may further include at least one thin film transistor and at least one capacitor so as to compensate an output current $I_{LD}$ supplied to the organic light emitting diode LD.

The switching thin film transistor Qs includes a control terminal, an input terminal, and an output terminal, and the control terminal is connected to the gate line 121, the input terminal is connected to the data line 171, and the output terminal is connected to the driving thin film transistor Qd. The switching thin film transistor Qs transmits the data signal applied to the data line 171 to the driving thin film transistor Qd in response to the scanning signal applied to the gate line 121.

The driving thin film transistor Qd also includes a control terminal, an input terminal, and an output terminal, and the control terminal is connected to the switching thin film transistor Qs, the input terminal is connected to the driving voltage line 172, and the output terminal is connected to the organic light emitting diode LD. The driving thin film transistor Qd provides an output current $I_{LD}$ that is variable by the voltage between the control terminal and the output terminal.

The capacitor Cst is connected between the control terminal and the input terminal of the driving thin film transistor Qd. The capacitor Cst charges the data signal applied to the control terminal of the driving thin film transistor Qd, and maintains it when the switching thin film transistor Qs is turned off.

The organic light emitting diode LD includes an anode connected to the output terminal of the driving thin film transistor Qd, and a cathode connected to a common voltage ELVSS. The organic light emitting diode LD displays images by emitting light with different intensities according to the output current $I_{LD}$ of the driving thin film transistor Qd.

An inter-layer configuration of the display device 1000 will now be described with reference to FIG. 2.

As described above, the display device 1000 includes a display area DA and a non-display area NDA.

The display device 1000 includes a substrate 110, and the substrate 110 is flexible.

A buffer layer 120 is disposed on the substrate 110. The buffer layer 120 may include a single layer of an insulating material, such as a silicon nitride (SiNx) or a silicon oxide (SiOx), or a plurality of layers forming a stack of insulating layers, each insulating layer including at least one of silicon nitride (SiNx) and silicon oxide (SiOx). The buffer layer 120 may prevent permeation of unnecessary components, such as impurities or moisture.

A first semiconductor layer 135 is disposed on the buffer layer 120 of the display area DA. The first semiconductor layer 135 may include polysilicon or an oxide semiconductor. In this instance, the oxide semiconductor may include one of an oxide made of titanium (Ti), hafnium (Hf), zirconium (Zr), aluminum (Al), tantalum (Ta), germanium (Ge), zinc (Zn), gallium (Ga), tin (Sn), or indium (In), or a compound oxide thereof.

The first semiconductor layer 135 includes a first channel region 1355, and a first source region 1356 and a first drain region 1357 disposed on respective sides of the first channel region 1355. The first channel region 1355 of the first semiconductor layer 135 may be a region in which no impurity is doped, and the first source region 1356 and the first drain region 1357 of the first semiconductor layer 135 may be regions in which a conductive impurity is doped.

In a like manner, a second semiconductor layer 145 is disposed on the buffer layer 120 of the non-display area NDA. The second semiconductor layer 145 includes a second channel region 1455, and a second source region 1456 and a second drain region 1457 disposed on respective sides of the second channel region 1455.

A gate insulating layer 140 is disposed on the first semiconductor layer 135 and the second semiconductor layer 145. The gate insulating layer 140 may be a single layer including tetraethyl orthosilicate (TEOS), a silicon oxide (SiOx), or a silicon nitride (SiNx), or a multilayer structure generated by stacking at least some of the aforementioned materials.

A first gate electrode 155 and a second gate electrode 156 are disposed on the gate insulating layer 140. The first gate electrode 155 overlaps the first channel region 1355, and the second gate electrode 156 overlaps the second channel region 1455.

The first gate electrode 155 and the second gate electrode 156 may be a single layer or a multilayer structure including a low-resistance material, such as aluminum (Al), titanium (Ti), molybdenum (Mo), copper (Cu), nickel (Ni), or an alloy thereof, or a high corrosion-resistant material.

A first interlayer insulating layer 160 is disposed on the first gate electrode 155 and the second gate electrode 156. The first interlayer insulating layer 160 may be a single layer including tetraethyl orthosilicate (TEOS), a silicon oxide (SiOx), or a silicon nitride (SiNx), or a multilayer structure generated by stacking at least some of the aforementioned materials.

The first interlayer insulating layer 160 and the gate insulating layer 140 include a first source contact hole 166 and a first drain contact hole 167 respectively overlapping the first source region 1356 and the first drain region 1357, and a second source contact hole 168 and a second drain contact hole 169 respectively overlapping the second source region 1456 and the second drain region 1457.

A first source electrode 173 and a first drain electrode 175, and a second source electrode 176 and a second drain electrode 177, are disposed on the first interlayer insulating layer 160. Further, a common voltage transmitting line w30 is disposed on the non-display area NDA and the first interlayer insulating layer 160.

The first source electrode 173 and the first drain electrode 175 are respectively connected to the first source region 1356 and the first drain region 1357 of the first semiconductor layer 135 through the first source contact hole 166 and the first drain contact hole 167. Similarly, the second source electrode 176 and the second drain electrode 177 are respectively connected to the second source region 1456 and the second drain region 1457 of the second semiconductor layer 145 through the second source contact hole 168 and the second drain contact hole 169.

The first source electrode 173 and the first drain electrode 175, and the second source electrode 176, and the second drain electrode 177 may be a single layer or a multilayer structure including a low-resistance material, such as aluminum (Al), titanium (Ti), molybdenum (Mo), copper (Cu), nickel (Ni), or an alloy thereof, or a high corrosion-resistant material. The common voltage transmitting line w30 may be simultaneously formed on the same layer as the first source electrode 173 and the first drain electrode 175, and the second source electrode 176 and the second drain electrode 177.

The first semiconductor layer 135, the first gate electrode 155, the first source electrode 173, and the first drain electrode 175 of the display area DA may configure the driving thin film transistor Qd of the pixel PX shown in FIG. 3, and the second semiconductor layer 145, the second gate electrode 156, the second source electrode 176, and the second drain electrode 177 of the non-display area NDA may configure a thin film transistor included in a gate driver disposed in the non-display area NDA. Although FIG. 2 shows each transistor in the display area DA and the non-display area NDA, which is disposed for ease of description, exemplary embodiments are not limited thereto.

A second interlayer insulating layer 180 is disposed on the first source electrode 173, the first drain electrode 175, the second source electrode 176, and the second drain electrode 177. The second interlayer insulating layer 180, in a like manner as the first interlayer insulating layer 160, may be a single layer including tetraethyl orthosilicate (TEOS), a silicon oxide (SiOx), or a silicon nitride (SiNx), or a multilayer structure generated by stacking at least some of the aforementioned materials.

The second interlayer insulating layer 180 includes a contact hole 82 overlapping the first drain electrode 175. The second interlayer insulating layer 180 is removed from the region overlapping the common voltage transmitting line w30, most of the common voltage transmitting line w30 does not overlap the second interlayer insulating layer 180, and part of an edge of the common voltage transmitting line w30 may overlap the second interlayer insulating layer 180. However, the entire portion of the common voltage transmitting line w30 may not overlap the second interlayer insulating layer 180.

A pixel electrode 710 is disposed on the second interlayer insulating layer 180. The pixel electrode 710 may be an anode of the organic light emitting diode LD of FIG. 3. The second interlayer insulating layer 180 is disposed between the pixel electrode 710 and the first drain electrode 175 according to some exemplary embodiments, but it may be disposed on a same layer as the pixel electrode 710 and the first drain electrode 175, and it may be integrally formed with the first drain electrode 175.

A partition wall 190 is disposed on the pixel electrode 710. The partition wall 190 includes an opening 195 overlapping the pixel electrode 710. The partition wall 190 may include a resin, such as a polyacrylate or a polyimide, and a silica-based inorganic material.

An organic emission layer 720 is disposed in the opening 195 of the partition wall 190. The organic emission layer 720 may have multiple layers including at least one of an emission layer, a hole injection layer (HIL), a hole transporting layer (HTL), an electron transporting layer (ETL), and an electron injection layer (EIL). When the organic emission layer 720 includes all of the aforementioned layers, a hole injection layer may be disposed on the pixel electrode 710 that is an anode, and a hole transporting layer, an emission layer, an electron transporting layer, and an electron injection layer may be sequentially stacked thereon.

A common electrode 730 is disposed on the partition wall 190 and the organic emission layer 720. The common electrode 730 is a cathode of the organic light emitting diode LD. In this manner, the pixel electrode 710, the organic emission layer 720, and the common electrode 730 configure an organic light emitting diode (or element) 70. The organic light emitting device may be one of front display type, a rear display type, and a both-side display type according to the direction in which the organic light emitting diode 70 emits light.

In the case of the front display type, the pixel electrode 710 may be a reflective layer, and the common electrode 730 may be a semi-transflective layer or a transmissive layer. In the case of the rear display type, the pixel electrode 710 may be a transflective layer, and the common electrode 730 may be a reflective layer. In the case of the both-side display type, the pixel electrode 710 and the common electrode 730 may be a transparent layer or a transflective layer. The reflective layer and the transflective layer may be at least one metal, such as at least one of magnesium (Mg), silver (Ag), gold (Au), calcium (Ca), lithium (Li), chromium (Cr), and aluminum (Al), or an alloy thereof. The reflective layer and the transflective layer are determined by thickness, and the transflective layer may be formed to have a thickness that is equal to or less than 200 nm. As the thickness becomes smaller, transmittance of light increases, and when the thickness is much less, resistance increases. The transparent layer may include an indium tin oxide (ITO), an indium zinc oxide (IZO), a zinc oxide (ZnO), and/or an indium oxide.

The common electrode 730 may be disposed on a side of the substrate 110 including the display area DA and the non-display area NDA, and it contacts the common voltage transmitting line w30 of the non-display area NDA and receives the common voltage ELVSS.

A first spacer SP1 and a second spacer SP2 are disposed on an external side of the non-display area NDA. The first spacer SP1 and the second spacer SP2 may include a same layer as a part from among the second interlayer insulating layer 180 disposed in the display area DA and an insulating layer formed with the same layer as a partition wall 190. That is, the first spacer SP1 may include the same layer as the second interlayer insulating layer 180 and the partition wall 190, and the second spacer SP2 may further include an additional insulating layer in addition to the second interlayer insulating layer 180 and the partition wall 190.

An encapsulation layer 80 is disposed on the common electrode 730. The encapsulation layer 80 may be formed by alternately stacking at least one inorganic layer and at least one organic layer, and the number of the inorganic layer or the organic layer may be plural.

According to some exemplary embodiments, the encapsulation layer 80 includes a first inorganic encapsulation layer 810 and a second inorganic encapsulation layer 820, and includes an organic encapsulation layer 830 disposed between the first inorganic encapsulation layer 810 and the second inorganic encapsulation layer 820.

The first inorganic encapsulation layer 810 and the second inorganic encapsulation layer 820 are formed on a side of the substrate 110, and are disposed on the first spacer SP1 and the second spacer SP2. The organic encapsulation layer 830 is not disposed on external sides of the first spacer SP1 and the second spacer SP2 in the non-display area NDA.

A thickness of the organic encapsulation layer 830 of the encapsulation layer 80 may be reduced as it extends toward the edge of the display area DA, and accordingly, the height of an upper side of the organic encapsulation layer 830 is relatively and gradually reduced. To prevent the thickness of the organic encapsulation layer 830 of the encapsulation layer 80 from being reduced at the edge of the display area DA, the amount of the organic material layer is increased when the organic encapsulation layer 830 is formed so that an organic encapsulation layer 830 with sufficient thickness may be formed on the edge of the display area DA. However, in this case, a reflow amount of the organic material increases. The organic layer may then be formed up to the external sides of the first spacer SP1 and the second spacer SP2, and hence, the probability of the organic encapsulation layer 830 of the encapsulation layer 80 being exposed on the outermost edge of the display device 1000 increases and vapor may permeate through the exposed organic layer, and the reliability of the display device 1000 may be reduced. Therefore, in order for the organic encapsulation layer 830 of the encapsulation layer 80 to not be disposed up to the external sides of the first spacer SP1 and the second spacer SP2, the thickness of the organic encapsulation layer 830 of the encapsulation layer 80 may be reduced on the edge of the display area DA by not increasing the amount of the organic material layer, so a surface height of the organic encapsulation layer 830 is reduced on the edge of the display area DA. That is, the upper side of the organic encapsulation layer 830 gradually becomes lower as it extends towards the external side of the display device 1000 from the edge region of the display area DA disposed near the border of the display area DA and the non-display area NDA.

The thickness of the organic encapsulation layer 830 disposed on the edge of the display area DA is reduced, and a cover layer 840 is disposed on the edge of the organic encapsulation layer 830. The cover layer 840 is disposed on the edge of the display area DA and the non-display area NDA of the organic encapsulation layer 830, and the cover layer 840 includes a portion for covering the edge portion of the organic encapsulation layer 830 of which the height of the upper side is gradually reduced, and it compensates for a step of the organic encapsulation layer 830 of which the thickness is relatively reduced by the cover layer 840. In this manner, the upper surfaces of the encapsulation layer 80 and the cover layer 840 become almost flat. Hence, the height of the encapsulation layer 80 is almost the same as the height of the cover layer 840, so a gap between the substrate 110 and the upper surface of the encapsulation layer 80 is almost the same as a gap between the substrate 110 and the upper surface of the cover layer 840.

The cover layer 840 is disposed on part of the edge of the display area DA and the non-display area NDA, and most thereof is disposed in the non-display area NDA. The cover layer 840 is disposed closer to the display area DA than is the second spacer SP2, which is disposed on the outermost part. That is, with respect to the display area DA, the cover layer 840 is not disposed to be further external than the second spacer SP2. The cover layer 840 is mainly disposed in the non-display area NDA, and overlaps the touch wires w10 and w20.

The cover layer 840 includes an organic material. Further, the cover layer 840 includes a light blocking material. The cover layer 840 may be formed on the encapsulation layer 80 by using a screen printing method or a photolithography method using a photosensitive organic material.

According to some exemplary embodiments, the cover layer 840 including an organic material includes a portion exposed to the outside, but the encapsulation layer 80 is disposed below the cover layer 840, thereby preventing reduced reliability caused by vapor permeation. The encapsulation layer 80 includes a stacked inorganic layer, so when vapor permeates through the cover layer 840, it does not reach the light-emitting device layer, e.g., the organic light emitting diode 70, by passing through the encapsulation layer 80.

Referring to FIGS. 1 and 2, a touch unit for sensing a touch is disposed on the encapsulation layer 80 and the cover layer 840. Here, a touch may include a case in which an external object, such as a finger of a user, directly contacts a touch side of the display device 1000, and a case in which the external object hovers while it is approaching the touch side of the display device 1000 or when it has approached the same. The touch unit may include a touch electrode 90 and touch wires w10 and w20 connected thereto. The touch electrode 90 receives a driving voltage from the touch wires w10 and w20. The touch electrode 90 may be disposed in the display area DA, and without being limited to this, it may be disposed in the non-display area NDA. The touch wires w10 and w20 may be disposed in the non-display area NDA, and they may include a portion disposed in the display area DA. The touch unit formed on the upper side of the display device 1000 as described above will be referred to as an on-cell type.

According to some exemplary embodiments, the touch sensor may include a plurality of touch electrodes 90, and the touch electrodes 90 may include a first touch electrode 91 and a second touch electrode 92. The first touch electrode 91 and the second touch electrode 92 may be alternately spread and disposed so that they may not overlap each other in the display area DA. The first touch electrode 91 and the second touch electrode 92 may be disposed on different layers.

The first touch electrode 91 includes a plurality of first electrode portions 91a and a plurality of first connectors 91b. A plurality of first electrode portions 91a of the first touch electrode 91 are disposed in the column direction and the row direction, respectively, and the first electrode portions 91a of a plurality of first touch electrodes 91 arranged in the same column or row may be connected to each other through a plurality of first connectors 91b.

In a like manner, the second touch electrode 92 includes a plurality of second electrode portions 92a and a plurality of second connectors 92b. A plurality of second electrode portions 92a of the second touch electrode 92 are disposed in the column direction and the row direction respectively, and the second electrode portions 92a of a plurality of second touch electrodes 92 arranged in the same column or row may be connected to each other through a plurality of second connectors 92b.

The first touch electrode 91 is connected to the first touch wire w10, and the second touch electrode 92 is connected to the second touch wire w20. The first touch electrode 91 and the second touch electrode 92 may have determined transmittance so that light emitted by the organic emission layer 720 may be transmitted therethrough. For example, the first touch electrode 91 and the second touch electrode 92 may be made of a thin metal layer, such as an indium tin oxide (ITO), an indium zinc oxide (IZO), or silver nanowire (AgNw), or a transparent conductive material, such as a metal mesh or carbon nanotubes (CNT), but exemplary embodiments are not limited thereto.

The first touch wire w10 and the second touch wire w20 may include a transparent conductive material included in a first touch electrode 91 and a second touch electrode 92, or a low-resistance material, such as molybdenum (Mo), silver (Ag), titanium (Ti), copper (Cu), aluminum (Al), or molybdenum/aluminum/molybdenum (Mo/Al/Mo).

First touch electrodes 91 neighboring each other and second touch electrodes 92 neighboring each other may form a self-sensing capacitance functioning as a touch sensor. The self-sensing capacitor may receive a sensing input signal and may be charged with a determined amount of charges, and when there is a contact of an external object, such as a finger, the stored amount of charges is changed and a sensing output signal that is different from the input sensing input signal may be output/sensed.

As described above, the touch sensor is disposed on the encapsulation layer 80 having a flat surface and the cover layer 840, so the gap between the common electrode 730 of the organic light emitting diode 70 and the first touch electrode 91 and the second touch electrode 92 of the touch unit may be constant (or substantially constant). By this, a difference of parasitic capacitance between the common electrode 730 and the first touch electrode 91 and the second touch electrode 92 of the touch unit may not be generated depending on a location. When a touch unit is formed on the encapsulation layer 80 having a step according to a position without a cover layer 840, the parasitic capacitance between the first touch electrode 91 and the second touch electrode 92 of the touch unit formed on the edge portion of the encapsulation layer 80 that is relatively thin and the common electrode 730 becomes relatively larger and the touch sensitivity may accordingly reduce.

Further, light emitted by the organic emission layer 720 disposed on the edge of the display area DA may leak toward the edge of the display area DA, and by this, light leakage may be generated around the edge of the display area DA. However, as described above, as the cover layer 840 includes a light blocking material, it blocks the light leaking around the edge of the display area DA to thus prevent light leakage from occurring around the edge of the display area DA.

Although not shown, the display device 1000 may further include an additional layer, such as a window on the touch unit.

A configuration of one pixel PX disposed in the display area DA of the display device shown in FIGS. 2 and 3 is merely an example, and the configuration of the pixel PX of the display device 1000 is not limited to the configuration shown in FIGS. 2 and 3. The signal lines 121, 171, and 172 and the organic light emitting diode 70 may be formed in any suitable configuration. For example, in FIG. 3, a display device 1000 including two thin film transistors Qs and Qd and one capacitor Cst in one pixel PX is shown with respect to the display device 1000, but exemplary embodiments are not limited thereto. Therefore, the display device 1000 is not limited in the number of thin film transistors, capacitors, and/or wires.

Figure 4:
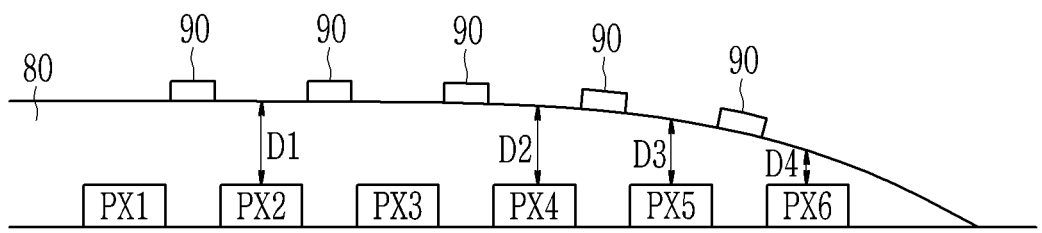
FIG. 4 shows a schematic view of part of a conventional display device.
Figure 5:
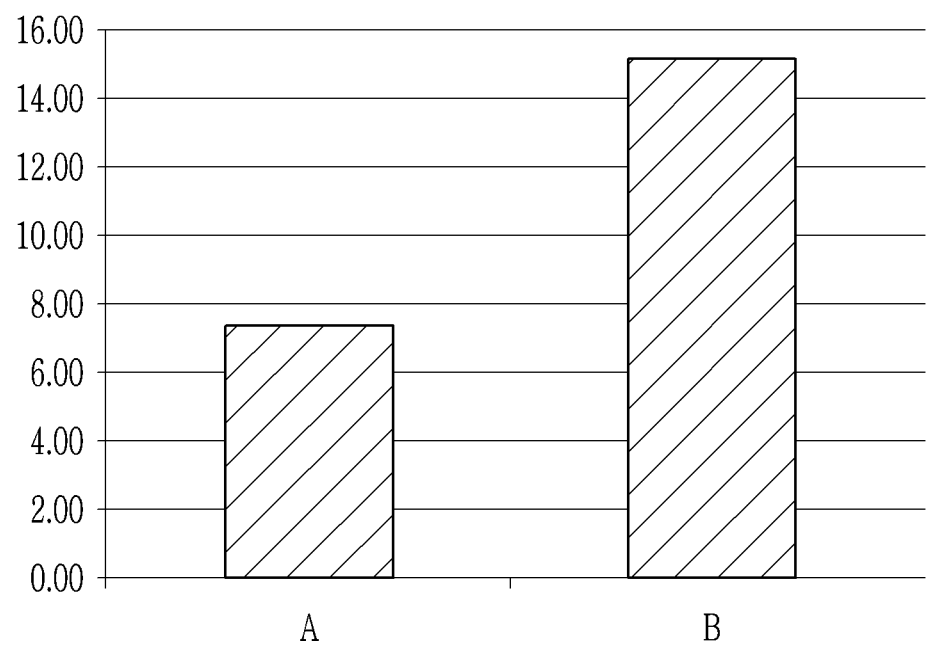
FIG. 5 shows a graph of a result of an experimental example.
Figure 6:
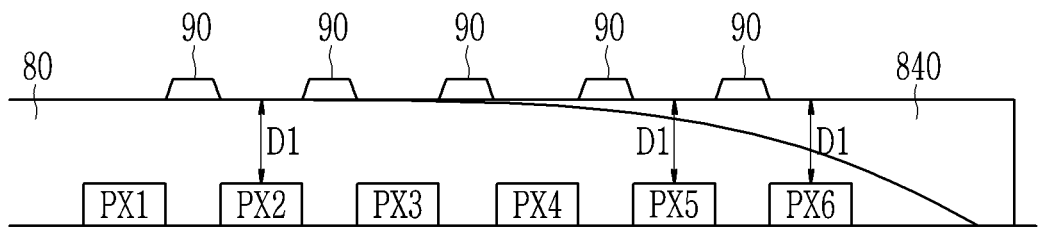
FIG. 6 shows a schematic view of part of a display device according to some exemplary embodiments.
Figure 7:
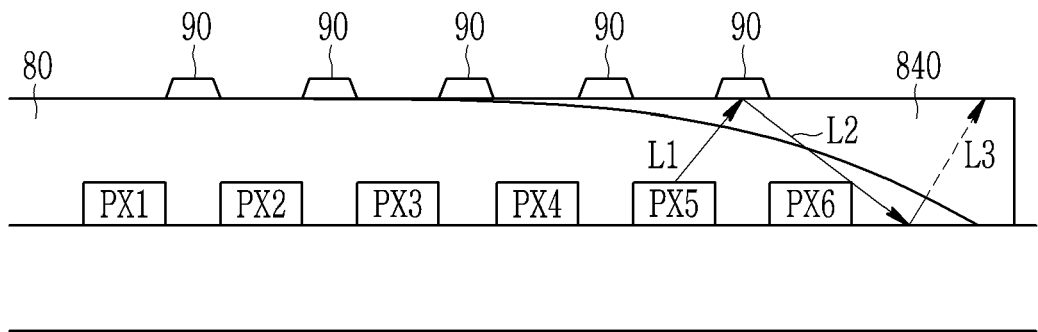
FIG. 7 shows a schematic view of part of a display device according to some exemplary embodiments.

Characteristics of a display device according to some exemplary embodiments will now be described with reference to FIGS. 4 to 7. FIG. 4 shows a schematic view of part of a conventional display device. FIG. 5 shows a graph of a result of an experimental example. FIG. 6 shows a schematic view of part of a display device according to some exemplary embodiments. FIG. 7 shows a schematic view of part of a display device according to some exemplary embodiments.

Referring to FIG. 4, the thickness of the encapsulation layer 80 disposed on a plurality of pixels PX1, PX2, PX3, PX4, PX5, and PX6 may be different according to the position of the pixels PX1, PX2, PX3, PX4, PX5, and PX6, and when a touch electrode 90 is formed on the encapsulation layer 80 having different thicknesses depending on the position, the gap between a plurality of pixels PX1, PX2, PX3, PX4, PX5, and PX6 and the touch electrode 90 may be different according to the position. For instance, there may be a first distance D1, a second distance D2, a third distance D3, and a fourth distance D4 that are different from each other according to the position. By this, the parasitic capacitance generated between the pixels PX1, PX2, PX3, PX4, PX5, and PX6 and the touch electrode 90 may be different according to the position, and particularly, the parasitic capacitance may be relatively large on the position where a relatively small third distance D3 and fourth distance D4 are disposed. Therefore, this may influence the touch sensitivity of the touch electrode 90.

A change in sensitivity of a touch electrode 90 according to an experimental example will now be described with reference to FIG. 5. In the present experimental example, sensitivity of the touch electrode 90 is measured for a first case (case A) in which the insulating layer between the common electrode 730 and the touch electrode 90 is formed to be about 4 μm thick, and a second case (case B) in which the insulating layer is formed to be about 8 μm thick. Other conditions except for the thickness of the insulating layer between the common electrode 730 and the touch electrode 90 are the same. As shown in FIG. 5, the touch sensitivity of the first case (case A) in which the thickness of the insulating layer between the common electrode 730 and the touch electrode 90 is relatively small is found to be less than the touch sensitivity of the second case (case B) in which the thickness of the insulating layer between the common electrode 730 and the touch electrode 90 is relatively large. As described, it is found that the touch sensitivity of the touch electrode 90 is variable by the thickness of the insulating layer between the common electrode 730 and the touch electrode 90.

Referring to FIG. 6, the display device according to some exemplary embodiments includes an encapsulation layer 80 disposed on a plurality of pixels PX1, PX2, PX3, PX4, PX5, and PX6, and the thickness of the encapsulation layer 80 is different according to the position. However, the cover layer 840 is disposed on the encapsulation layer 80 that is relatively less thick, and the cover layer 840 compensates for the step of the encapsulation layer 80 caused by the fact that the thickness of the encapsulation layer 80 is different according to the position, so the surfaces of the encapsulation layer 80 and the cover layer 840 are flat. In this manner, the gap between a plurality of pixels PX1, PX2, PX3, PX4, PX5, and PX6 and the touch electrode 90 is constant to be the first distance D1. Therefore, the parasitic capacitance generated between the pixels PX1, PX2, PX3, PX4, PX5, and PX6 and the touch electrode 90 is constant, and the change in touch sensitivity generated by the difference of parasitic capacitance may be reduced.

Referring to FIG. 7, part of the light emitted by a plurality of pixels PX1, PX2, PX3, PX4, PX5, and PX6 may be input (or incident) to the touch electrode 90 along a first line L1, may be reflected to a second line L2 going toward the edge of the display area DA, and may be reflected to a third line L3. As described, the light going toward the edge of the display area DA may be seen as light leakage on the edge of the display area DA, but the cover layer 840 of the display device according to some exemplary embodiments includes a light blocking material, so the light reflected to the third line L3 is blocked by the cover layer 840 and is not seen. The cover layer 840 of the display device 1000 may prevent the light leakage on the edge of the display area DA.

Figure 8:
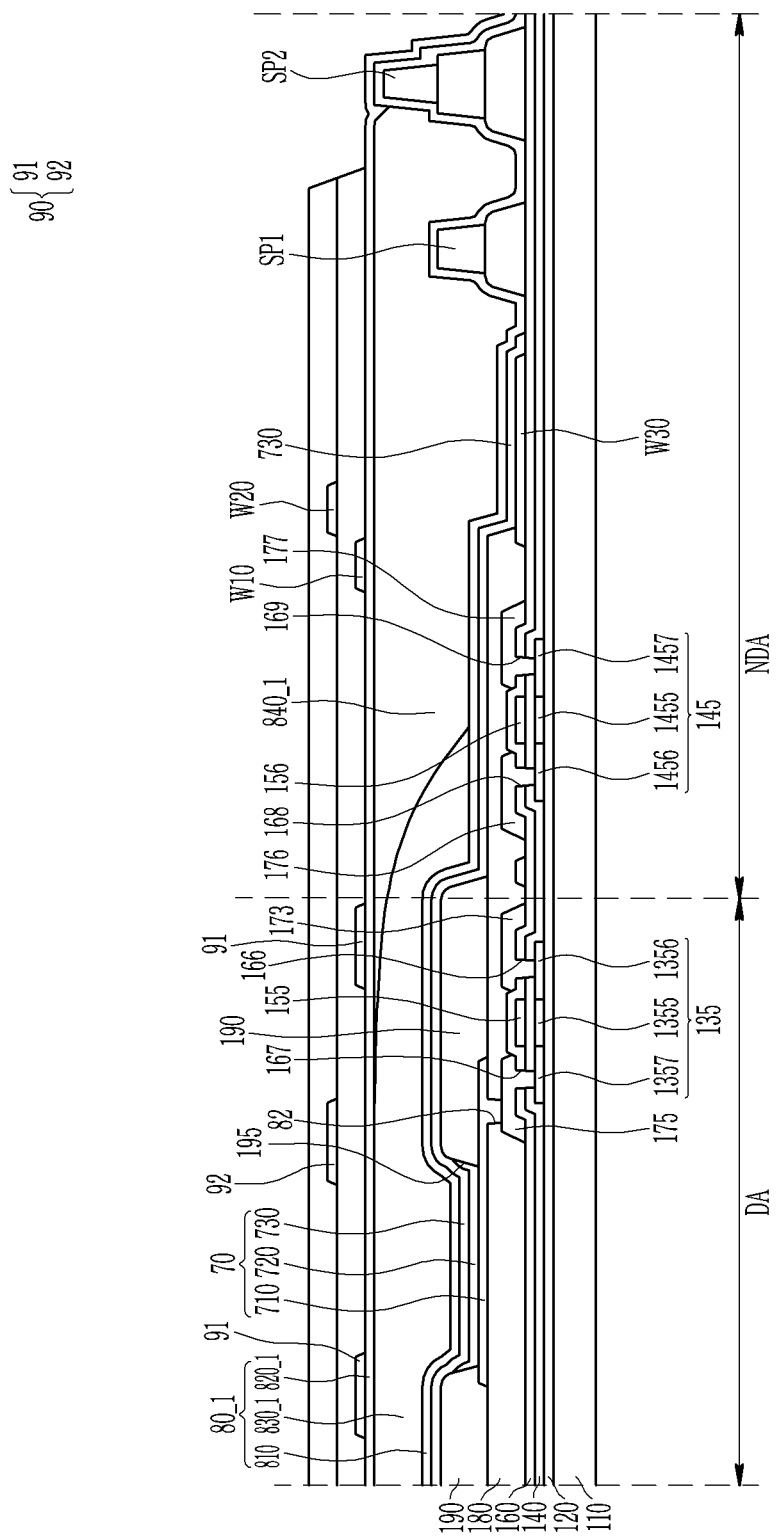
FIG. 8 shows a cross-sectional view of part of a display device according to some exemplary embodiments.

A display device according to some exemplary embodiments will now be described with reference to FIG. 8. FIG. 8 shows a cross-sectional view of part of a display device according to some exemplary embodiments.

Referring to FIG. 8, the display device is similar to the display device 1000 in FIG. 2. As such, no detailed description of the same constituent elements will be provided.

Referring to FIG. 8, regarding the display device differing from the display device 1000 shown in FIG. 2, the cover layer 840_1 as well as the organic encapsulation layer 830_1 is disposed between the first inorganic encapsulation layer 810 and the second inorganic encapsulation layer 820_1 of the encapsulation layer 80_1. That is, the second inorganic encapsulation layer 820_1 of the encapsulation layer 80_1 is disposed on the cover layer 840_1 in addition to the organic encapsulation layer 830_1. Similar to as described above, the second inorganic encapsulation layer 820_1 is disposed on the cover layer 840_1 in addition to the organic encapsulation layer 830_1, thereby preventing impurity (e.g., moisture, etc.) permeation from the outside.

As with the display device 1000 shown in FIG. 2, the thickness of the organic encapsulation layer 830_1 of the display device shown in FIG. 8 is disposed on the edge of the display area DA is reduced, and the cover layer 840_1 is disposed on the edge portion of the organic encapsulation layer 830_1 with a low thickness. The cover layer 840_1 is disposed on the edge of the display area DA with the organic encapsulation layer 830_1 and the non-display area NDA, the cover layer 840_1 includes a portion for covering the edge portion of the organic encapsulation layer 830_1 of which a height of an upper side is gradually reduced. In this manner, the cover layer 840_1 compensates for the step of the organic encapsulation layer 830_1 of which the thickness is relatively reduced by the cover layer 840_1, and the upper surfaces of the encapsulation layer 80_1 and the cover layer 840_1 become almost flat. Further, the touch electrode 90 is disposed on the encapsulation layer 80_1 with a flat surface and the cover layer 840_1, so the gap between the common electrode 730 of the organic light emitting diode 70 and the first touch electrode 91 and the second touch electrode 92 of the touch unit may be constant or substantially constant. By this, a difference in parasitic capacitance between the common electrode 730 and the first touch electrode 91 and the second touch electrode 92 of the touch unit is not generated, thereby preventing the change in touch sensitivity.

Further, as the cover layer 840_1 includes a light blocking material, it blocks the light leaking around the edge of the display area DA to thus prevent light leakage occurring around the edge of the display area DA. Other characteristics of the above-described display device 1000 are applicable to the display device of FIG. 8.

Figure 9:
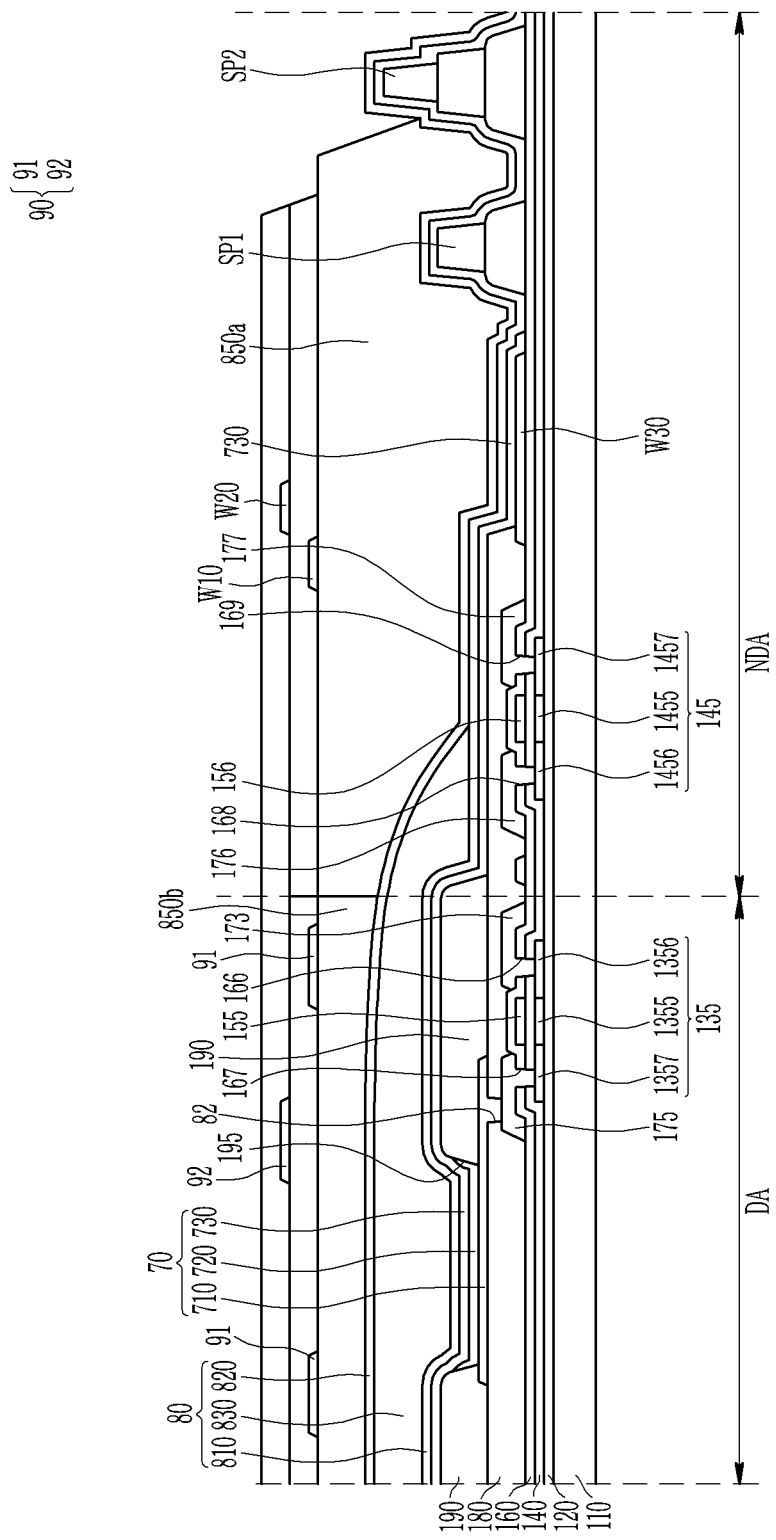
FIG. 9 shows a cross-sectional view of part of a display device according to some exemplary embodiments.

A display device according to some exemplary embodiments will now be described with reference to FIG. 9. FIG. 9 shows a cross-sectional view of part of a display device according to some exemplary embodiments.

Referring to FIG. 9, the display device is similar to the display devices shown in FIGS. 2 and 8. As such, no detailed descriptions of the same constituent elements will be provided.

Referring to FIG. 9, the display device is different from the display device 1000 shown in FIG. 2 in that a first cover layer 850a and a second cover layer 850b are at least disposed on the organic encapsulation layer 830. The first cover layer 850a is disposed in the non-display area NDA, and overlaps the touch wires w10 and w20. Further, the second cover layer 850b is disposed in the display area DA, and overlaps the touch electrode 90.

The first cover layer 850a and the second cover layer 850b include an organic material, and the surfaces of the first cover layer 850a and the second cover layer 850b are flat. The first cover layer 850a disposed in the non-display area NDA includes a light blocking material and is opaque, and the second cover layer 850b disposed in the display area DA may be transparent.

As previously described, the thickness of the organic encapsulation layer 830 disposed on the edge of the display area DA is reduced to thus generate a step depending on the position. The first cover layer 850a and the second cover layer 850b that respectively have a flat surface are disposed on the encapsulation layer 80, and the touch electrode 90 is disposed on the first cover layer 850a and the second cover layer 850b, so the gap between the common electrode 730 of the organic light emitting element 70 and the first touch electrode 91 and the second touch electrode 92 of the touch unit may be constant or substantially constant. By this, a difference in parasitic capacitance between the common electrode 730 and the first touch electrode 91 and the second touch electrode 92 of the touch unit is not generated, thereby preventing the change in touch sensitivity. The first cover layer 850a and the second cover layer 850b are thicker than the step of the encapsulation layer 80, thereby compensating the step of the encapsulation layer 80.

Further, the first cover layer 850a disposed in the non-display area NDA includes a light blocking material, so it blocks the light leaking toward the edge of the display area DA to thus prevent light leakage that may be generated on the edge of the display area DA. The second cover layer 850b disposed in the display area DA is formed of a transparent material to thereby prevent the reduction of luminance of the display area DA. Other characteristics of the above-described display devices of FIGS. 2 and 8 are applicable to the display device of FIG. 9.

Figure 10:
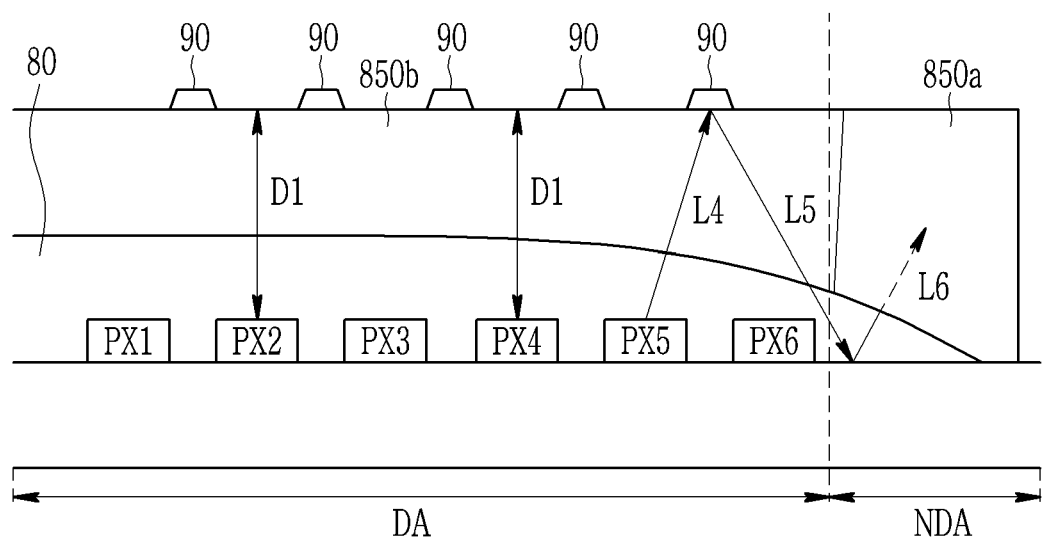
FIG. 10 shows a schematic view of part of a display device according to some exemplary embodiments.

Characteristics of the display device of FIG. 9 will now be described with reference to FIG. 10. FIG. 10 shows a schematic view of part of a display device according to some exemplary embodiments.

Referring to FIG. 10, the display device includes an encapsulation layer 80 disposed on a plurality of pixels PX1, PX2, PX3, PX4, PX5, and PX6, and the thickness of the encapsulation layer 80 is reduced from the edge of the display area DA and it becomes further reduced in the non-display area NDA. Therefore, the encapsulation layer 80 generates a step on the edge of the display area DA. However, the first cover layer 850a and the second cover layer 850b that respective have a flat surface are disposed on the encapsulation layer 80, and the touch electrode 90 is disposed on the first cover layer 850a and the second cover layer 850b, so the gap between a plurality of pixels PX1, PX2, PX3, PX4, PX5, and PX6 and the touch electrode 90 is the first distance D1, which is constant. Therefore, the parasitic capacitance generated between the pixels PX1, PX2, PX3, PX4, PX5, and PX6 and the touch electrode 90 is constant, and the change in touch sensitivity generated by the difference of parasitic capacitance may be reduced.

Further, part of the light emitted by the plurality of pixels PX1, PX2, PX3, PX4, PX5, and PX6 is input (or incident) to the touch electrode 90 along the fourth line L4, is reflected to the fifth line L5 disposed toward the edge of the display area DA, and may be reflected to the sixth line L6. As described, light disposed toward the edge of the display area DA may be seen as light leakage on the edge of the display area DA, but the first cover layer 850a disposed in the non-display area NDA of the display device of FIG. 9 includes a light blocking material, so the light reflected to the sixth line L6 is blocked by the first cover layer 850a and is not seen at the outside. The first cover layer 850a of the display device may prevent the light leakage on the edge of the display area DA.

Figure 11:
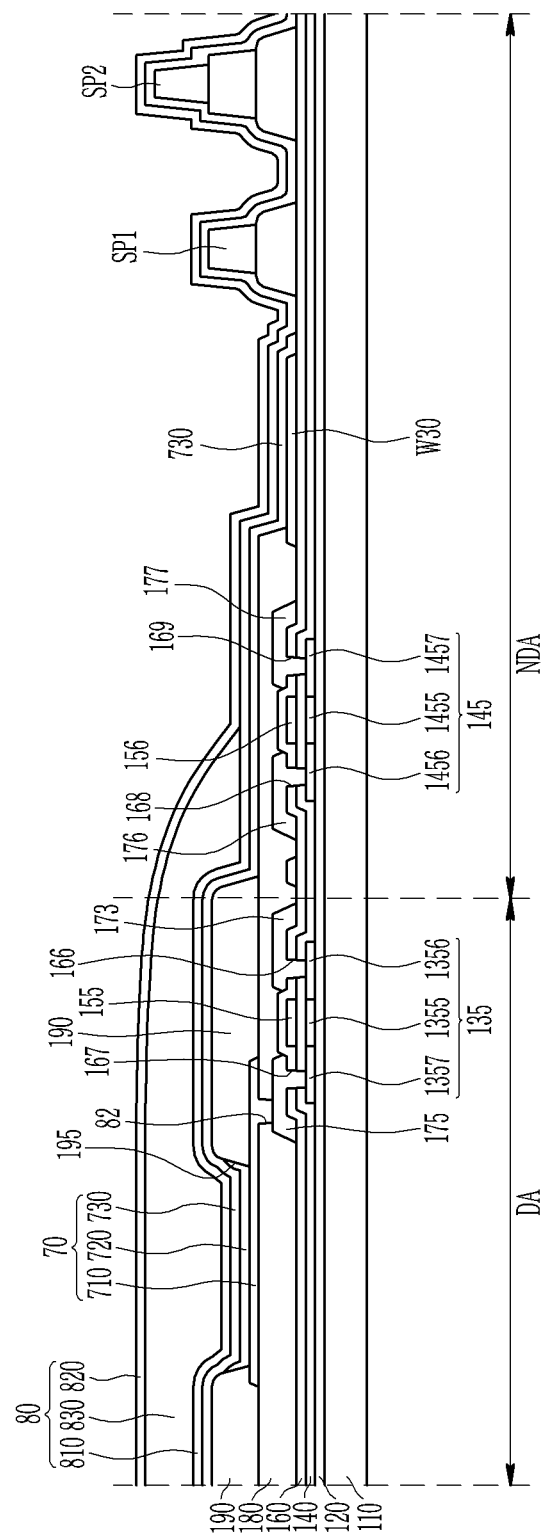
FIGS. 11 and 12 show cross-sectional views of a display device at various stages of manufacture according to some exemplary embodiments.
Figure 12:
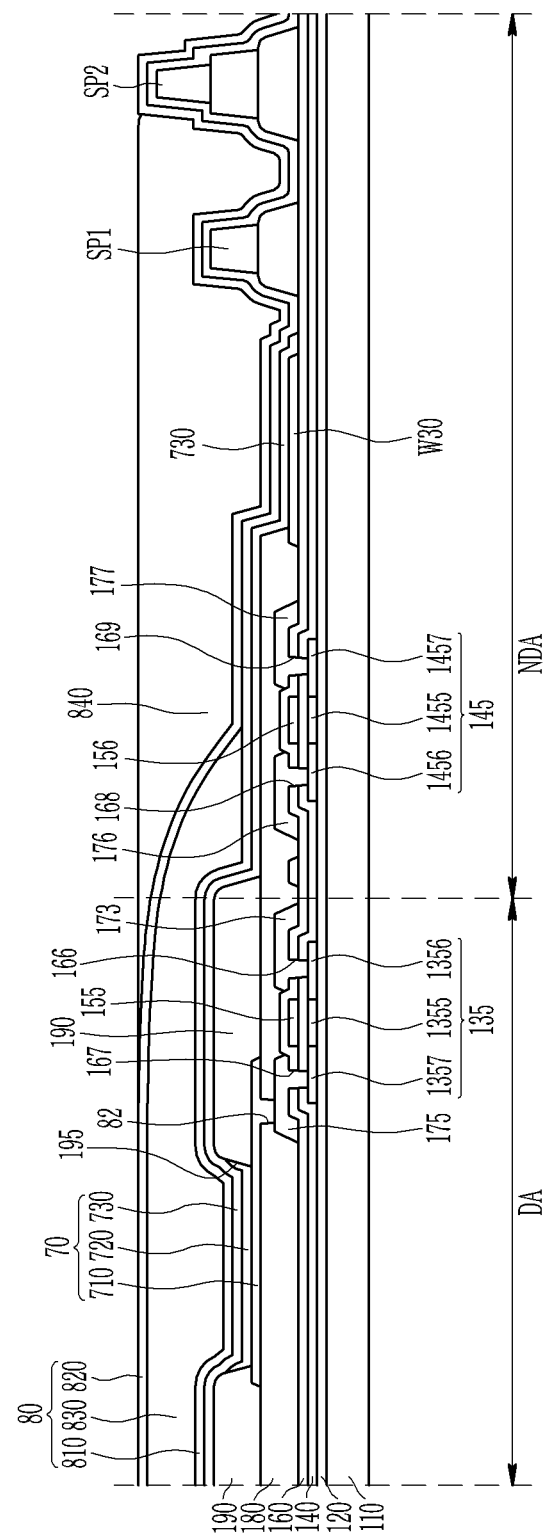

A method of manufacturing display device 1000 will now be described with reference to FIGS. 2, 11, and 12. FIGS. 11 and 12 show cross-sectional views of a display device at various stages of manufacture according to some exemplary embodiments.

Referring to FIG. 11, a buffer layer 120, a first semiconductor layer 135, a second semiconductor layer 145, a gate insulating layer 140, a first gate electrode 155, a second gate electrode 156, and a first interlayer insulating layer 160 are formed on the substrate 110, a first source contact hole 166 and a first drain contact hole 167 overlapping the first source region 1356 and the first drain region 1357, and a second source contact hole 168 and a second drain contact hole 169 overlapping the second source region 1456 and the second drain region 1457 are formed in the first interlayer insulating layer 160 and the gate insulating layer 140. A first source electrode 173, a first drain electrode 175, a second source electrode 176, a second drain electrode 177, a common voltage transmitting line w30, a second interlayer insulating layer 180, a pixel electrode 710, a partition wall 190, an organic emission layer 720, a common electrode 730, first and second spacers SP1 and SP2, and an encapsulation layer 80 are formed. The thickness of the organic encapsulation layer 830 is gradually reduced as it extends towards the non-display area NDA from the edge of the display area DA, and hence, the height of the encapsulation layer 80 is gradually reduced toward the non-display area NDA from the edge of the display area DA.

As shown in FIG. 12, a cover layer 840 is formed by stacking an organic material layer including a light blocking material and performing a photolithography process. The cover layer 840 may be formed by a screen printing method. The cover layer 840 is disposed on the edge of the display area DA with a thin organic encapsulation layer 830 and in the non-display area NDA. The cover layer 840 compensates the step of the organic encapsulation layer 830 according to the position so the upper surfaces of the encapsulation layer 80 and the cover layer 840 become almost flat.

As shown in FIG. 2, a touch unit including a touch electrode 90 and touch wires w10 and w20 is formed on the encapsulation layer 80 and the cover layer 840. Although not shown, an additional layer, such as a window may be formed on the touch unit.

As described, according to the method of manufacturing display device 1000, the touch electrode 90 is formed on the encapsulation layer 80 and the cover layer 840 that have a flat surface, and the gap between the common electrode 730 of the organic light emitting diode 70 and the touch electrode 90 is constant such that the change in touch sensitivity of the touch electrode 90 may be prevented. The cover layer 840 is formed to include a light blocking material, thereby preventing light leaking toward the edge of the display area DA and preventing light leakage that may be generated around the edge of the display area DA.

Figure 13:
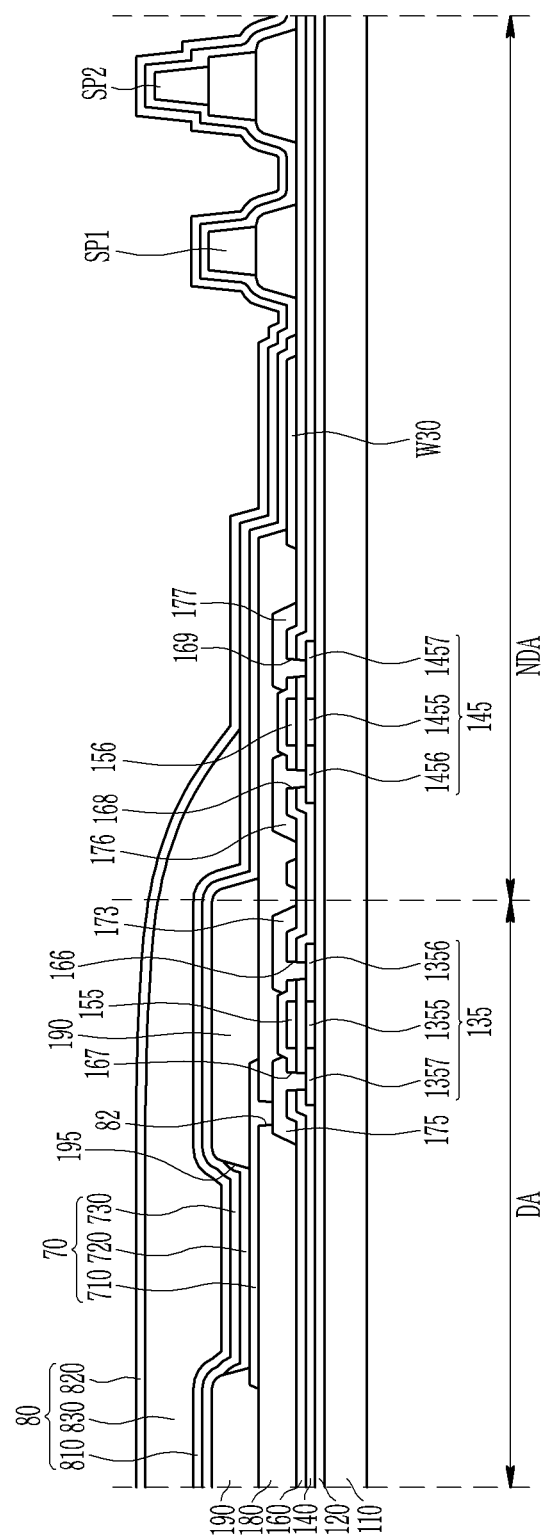
FIGS. 13, 14, and 15 show cross-sectional views of a display device at various stages of manufacture according to some exemplary embodiments.
Figure 14:
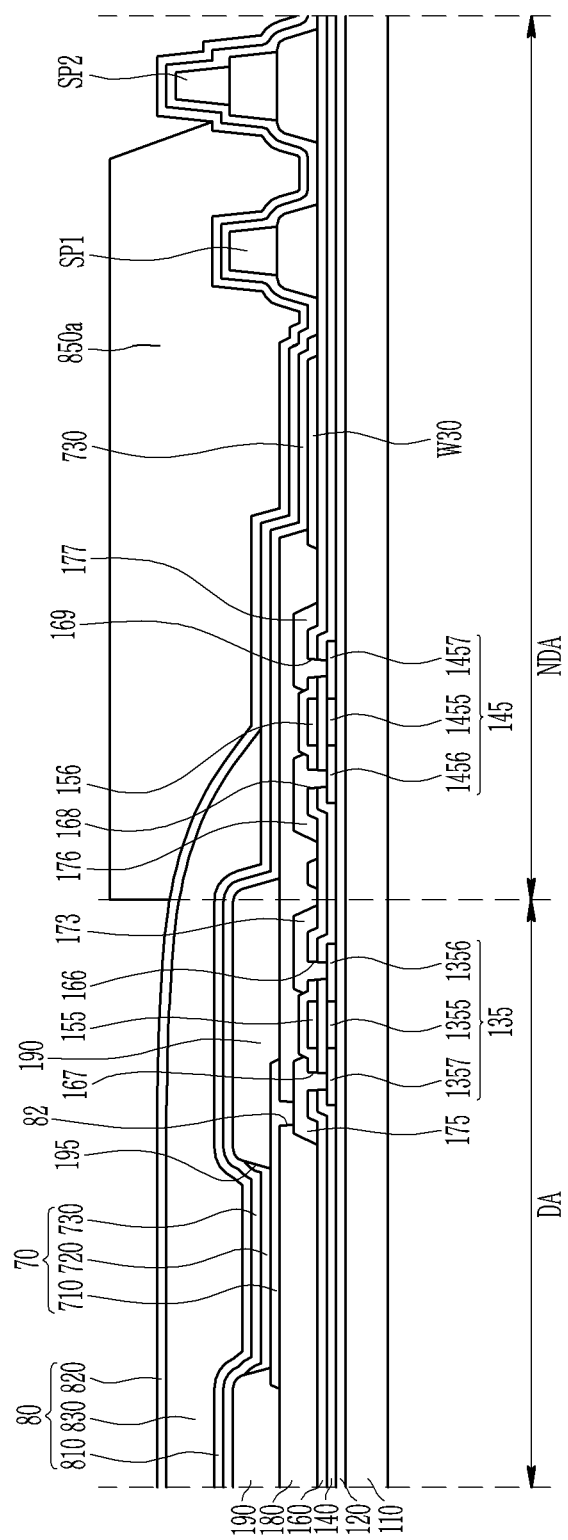
Figure 15:
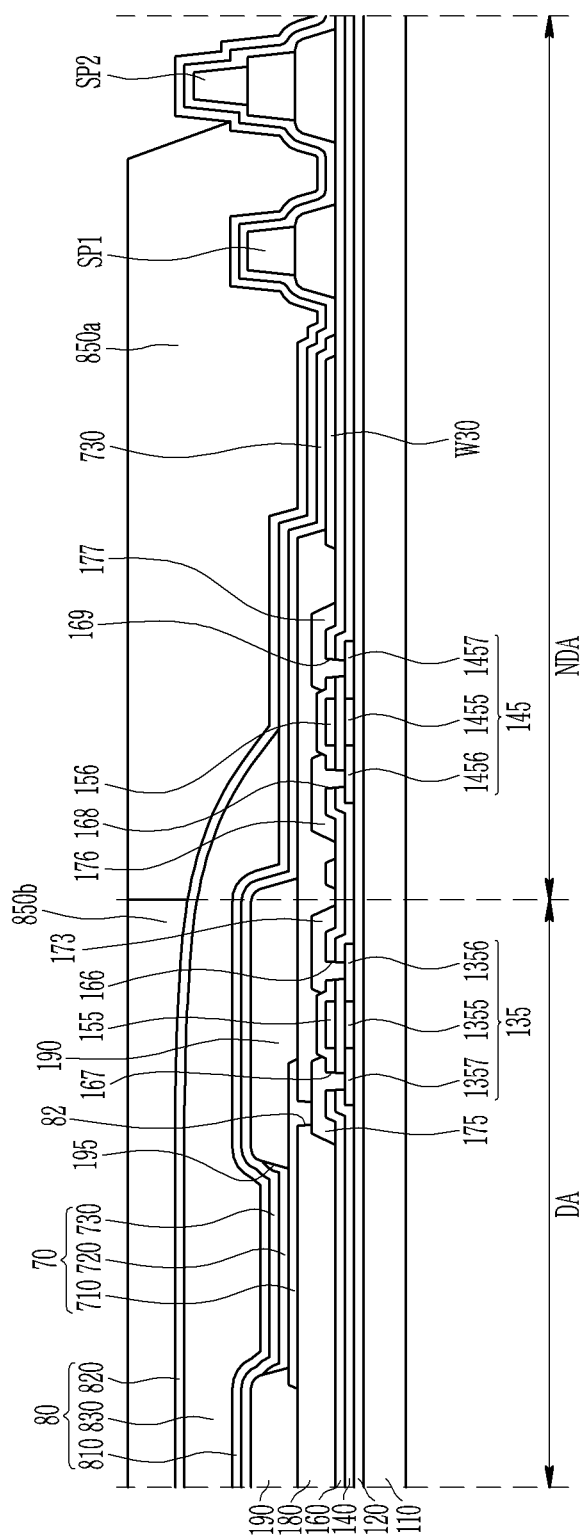

A method for manufacturing the display device of FIG. 9 will now be described with reference to FIGS. 9 and 13 to 15. FIGS. 13, 14, and 15 show cross-sectional views of a display device at various stages of manufacture according to some exemplary embodiments.

Referring to FIG. 13, a buffer layer 120, a first semiconductor layer 135, a second semiconductor layer 145, a gate insulating layer 140, a first gate electrode 155, a second gate electrode 156, and a first interlayer insulating layer 160 are formed on the substrate 110. A first source contact hole 166 and a first drain contact hole 167 overlapping the first source region 1356 and the first drain region 1357, and a second source contact hole 168 and a second drain contact hole 169 overlapping the second source region 1456 and the second drain region 1457 are formed on the first interlayer insulating layer 160 and the gate insulating layer 140. A first source electrode 173, a first drain electrode 175, a second source electrode 176, a second drain electrode 177, a common voltage transmitting line w30, a second interlayer insulating layer 180, a pixel electrode 710, a partition wall 190, an organic emission layer 720, a common electrode 730, first and second spacers SP1 and SP2, and an encapsulation layer 80 are formed. The thickness of the organic encapsulation layer 830 is gradually reduced as it extends towards the non-display area NDA from the edge of the display area DA, and hence, the height of the encapsulation layer 80 becomes gradually reduced as it extends towards the non-display area NDA from the edge of the display area DA.

Referring to FIG. 14, a first cover layer 850a made of an organic material layer including a light blocking material is formed on the encapsulation layer 80 disposed in the non-display area NDA. The first cover layer 850a is formed by stacking an organic material layer including a light blocking material and performing a photolithography process. The first cover layer 850a may be formed by the screen printing method. The first cover layer 850a is disposed in the non-display area NDA, and is formed to, for instance, wrap the display area DA.

As shown in FIG. 15, the first cover layer 850a is disposed as a partition wall on the encapsulation layer 80 of the display area DA surrounded by the first cover layer 850a disposed in the non-display area NDA, and a transparent organic material is stacked by inkjet printing, thereby forming a second cover layer 850b in the display area DA. The surface of the first cover layer 850a disposed in the non-display area NDA and the surface of the second cover layer 850b disposed in the display area DA are flat.

As shown in FIG. 9, a touch unit including a touch electrode 90 and touch wires w10 and w20 is formed on the first cover layer 850a and the second cover layer 850b that respectively have a flat surface. The touch electrode 90 overlaps the second cover layer 850b, and the touch wires w10 and w20 overlap the first cover layer 850a. Although not shown, an additional layer, such as a window may be formed on the touch unit.

As described, according to the method for manufacturing the display device of FIG. 9, the touch electrode 90 is disposed on the first cover layer 850a and the second cover layer 850b that have a flat surface such that the change in touch sensitivity of the touch electrode 90 may be prevented by maintaining the gap between the common electrode 730 of the organic light emitting diode 70 and the touch electrode 90. The first cover layer 850a disposed in the non-display area NDA is formed to include a light blocking material so light leakage that may be generated around the edge of the display area DA may be prevented by blocking the light leaking around the edge of the display area DA. In addition, the reduction of luminance of the display area DA may be prevented by forming the second cover layer 850b in the display area DA with a transparent material.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
a substrate comprising:
a display area comprising pixels, the pixels comprising emitting layers; and
a non-display area disposed outside the display area;
a thin film encapsulation layer disposed on the substrate;
a cover layer overlapping an edge of the thin film encapsulation layer such that the cover layer is disposed on an edge of the display area and in the non-display area; and
a touch unit disposed on the thin film encapsulation layer and the cover layer,
wherein the cover layer comprises a light blocking material, and
wherein the cover layer does not overlap the emitting layers of the pixels.

2. The display device of claim 1, wherein:
the thin film encapsulation layer is thinner at the edge of the thin film encapsulation layer than at a center of the thin film encapsulation layer; and
heights of upper surfaces of the thin film encapsulation layer and the cover layer from the surface of the substrate are substantially equivalent, the upper surfaces being substantially flat.

3. The display device of claim 2, wherein:
the touch unit comprises touch electrodes and touch wires connected to the touch electrodes; and
the cover layer overlaps the touch wires.

4. The display device of claim 3, further comprising:
a driving voltage line and spacers disposed in the non-display area,
wherein, in a view perpendicular to the surface of the substrate, the cover layer overlaps the driving voltage line, and
wherein, in the view perpendicular to the substrate of the substrate, the cover layer overlaps a first spacer among the spacers and is spaced apart from a second spacer among the spacers.

5. The display device of claim 4, wherein:
the thin film encapsulation layer comprises inorganic insulating layers and at least one organic insulating layer; and
in a direction perpendicular to the surface of the substrate, the inorganic insulating layers of the thin film encapsulation layer are disposed between the cover layer and the substrate.

6. The display device of claim 4, wherein:
the thin film encapsulation layer comprises inorganic insulating layers and at least one organic insulating layer; and
in a direction perpendicular to the surface of the substrate, the organic insulating layer and the cover layer are disposed between at least two of the inorganic insulating layers of the thin film encapsulation layer.

7. A display device comprising:
a substrate comprising:
a display area comprising pixels, the pixels comprising transistors and emitting layers; and
a non-display area disposed outside the display area;
a thin film encapsulation layer disposed on the substrate;
a first cover layer disposed on the thin film encapsulation layer and in the non-display area;
a second cover layer disposed on the thin film encapsulation layer and in the display area such that the second cover layer is laterally adjacent to the first cover layer; and
a touch unit disposed on the first cover layer and the second cover layer,
wherein the first cover layer comprises a light blocking material without overlapping the transistors and the emitting layers of the pixels, and
wherein the second cover layer is at least translucent.

8. The display device of claim 7, wherein upper surfaces of the first cover layer and the second cover layer have substantially equivalent heights from a surface of the substrate, the upper surfaces being substantially flat.

9. The display device of claim 8, wherein:
the touch unit comprises touch electrodes and touch wires connected to the touch electrodes;
the first cover layer overlaps the touch wires; and
the second cover layer overlaps the touch electrodes.

10. The display device of claim 9, further comprising:
a driving voltage line and spacers disposed in the non-display area,
wherein:
the first cover layer overlaps the driving voltage line;
in a direction perpendicular to the surface of the substrate, the first cover layer overlaps a first spacer among the spacers; and
in the direction perpendicular to the surface of the substrate, the first cover layer is spaced apart from a second spacer among the spacers.

11. A method of manufacturing a display device, comprising:
forming a thin film encapsulation layer on a substrate, the substrate comprising:
a display area comprising pixels, the pixels comprising emitting layers; and
a non-display area disposed outside the display area;
forming a cover layer overlapping an edge of the thin film encapsulation layer, the cover layer being formed on an edge of the display area and in the non-display area, the cover layer not overlapping the emitting layers of the pixels; and
forming a touch unit on the thin film encapsulation layer and the cover layer,
wherein forming the cover layer comprises:
stacking an organic material comprising a light blocking material; and
performing a photolithography process.

12. The method of claim 11, wherein:
the thin film encapsulation layer is thinner at the edge of the thin film encapsulation layer than at a center of the thin film encapsulation layer; and
upper surfaces of the thin film encapsulation layer and the cover layer are formed to have substantially equivalent heights from the surface of the substrate, the upper surfaces being formed to be substantially flat.

13. The method of claim 12, wherein:
forming the touch unit comprises forming touch electrodes on the substrate and touch wires connected to the touch electrodes; and
the cover layer is formed to overlap the touch wires.

14. The method of claim 13, further comprising:
forming a driving voltage line and spacers in the non-display area,
wherein, in a direction perpendicular to the surface of the substrate, the cover layer is formed to overlap the driving voltage line, overlap a first spacer among the spacers, and be spaced apart from a second spacer among the spacers.

15. The method of claim 11, wherein:
the thin film encapsulation layer is formed comprising inorganic insulating layers and at least one organic insulating layer; and
in a direction perpendicular to a surface of the substrate, the cover layer and the at least one organic insulating layer are disposed between at least two of the inorganic insulating layers.

16. A method of manufacturing a display device, comprising:
forming a thin film encapsulation layer on a substrate, the substrate comprising:
a display area comprising pixels, the pixels comprising transistors and emitting layers; and
a non-display area disposed outside the display area;
forming a first cover layer on the thin film encapsulation layer and in the non-display area without overlapping the transistors and the emitting layers of the pixels;
forming a second cover layer on the thin film encapsulation layer and in the display area such that the second cover layer is formed laterally adjacent to the first cover layer; and
forming a touch unit on the first cover layer and the second cover layer,
wherein forming the first cover layer comprises:
stacking an organic material comprising a light blocking material; and
performing a photolithography process, and
wherein the second cover layer is formed of an at least translucent organic material.

17. The method of claim 16, wherein forming the second cover layer comprises stacking, via inkjet printing, an organic material in a region surrounded by the first cover layer.

18. The method of claim 17, wherein upper surfaces of the first cover layer and the second cover layer are formed to have substantially equivalent heights from a surface of the substrate, the upper surfaces being formed to be substantially flat.

19. The method of claim 18, wherein:
forming the touch unit comprises forming touch electrodes and touch wires connected to the touch electrodes;
the first cover layer is formed to overlap the touch wires; and
the second cover layer is formed to overlap the touch electrodes.

20. The method of claim 19, further comprising:
forming a driving voltage line and spacers in the non-display area,
wherein, in a direction perpendicular to the surface of the substrate, the cover layer is formed to overlap the driving voltage line, overlap a first spacer among the spacers, and be spaced apart from a second spacer among the spacers.

* * * * *